United States Patent [19]
Volovich

[11] Patent Number: 5,125,791
[45] Date of Patent: Jun. 30, 1992

[54] SEMICONDUCTOR OBJECT PRE-ALIGNING METHOD

[75] Inventor: Vladimir W. R. Volovich, San Jose, Calif.

[73] Assignee: Cybeg Systems, Inc., Menlo Park, Calif.

[21] Appl. No.: 629,065

[22] Filed: Dec. 14, 1990

Related U.S. Application Data

[63] Continuation of Ser. No. 356,319, May 23, 1989, abandoned.

[51] Int. Cl.⁵ .............................................. B65G 47/24
[52] U.S. Cl. ..................................... 414/786; 356/400; 250/548; 414/757; 414/779; 198/394
[58] Field of Search .......................................... 33/520

[56] References Cited

U.S. PATENT DOCUMENTS

| | | | |
|---|---|---|---|
| 4,026,031 | 5/1977 | Siddall et al. | 33/520 X |
| 4,457,664 | 7/1984 | Judell et al. | 414/779 |
| 4,752,898 | 6/1988 | Koenig | 414/779 X |
| 4,765,793 | 8/1988 | Goddeau | 414/416 |
| 4,833,790 | 5/1989 | Spencer et al. | 33/520 |
| 4,846,626 | 6/1989 | Engelbrecht | 414/754 |
| 4,880,348 | 11/1989 | Baker et al. | 414/754 X |
| 4,887,904 | 12/1989 | Nakazato et al. | 414/757 X |
| 4,907,035 | 3/1990 | Galburt et al. | 356/150 |
| 4,938,654 | 7/1990 | Schram | 414/757 |

FOREIGN PATENT DOCUMENTS

0278462  8/1988  European Pat. Off. .

Primary Examiner—Robert J. Spar
Assistant Examiner—William M. Heinz
Attorney, Agent, or Firm—Flehr, Hohbach, Test, Albritton & Herbert

[57] ABSTRACT

A prealigner for semiconductor wafers is described, together with a method for prealigning. The prealigner includes mechanism for holding the wafer in a non-slip manner and motive means for adjusting the position of its engagement with the wafer as necessary to make the geometric center of the wafer precisely coincident with a chose position. The alignment method results in eliminating parts of original equations during the calculations of the location of the geometric center and flats or other distinguishing features on the edge of the wafer are located by utilizing a particular equation for a plurality of overlapping sections of the edge.

13 Claims, 2 Drawing Sheets

SEMICONDUCTOR OBJECT PRE-ALIGNING METHOD

CROSS-REFERENCE TO RELATED APPLICATION

This is a continuation of patent application Ser. No. 07/356,319 filed May 23, 1989, now abandoned.

BACKGROUND OF THE INVENTION

The present invention relates to pre-aligning of semiconductor objects and, more particularly, to a method and apparatus for pre-aligning a semiconductor object, such as a semiconductive wafer.

In the semiconductor industry it is common to pre-align a semiconductive wafer as part of readying the same for processing, such as the fabrication of integrated circuitry, as well as during such processing. The pre-alignment operation typically includes locating and precisely positioning the geometric center of the wafer, and placing such wafer in a selected orientation related to the orientation of its crystalline structure. This pre-alignment is typically provided in a separate operation before a wafer is transported to apparatus for providing a desired finishing or processing step. Moreover, such finishing and/or processing step may require a greater degree of alignment accuracy than is possible while the wafer is being moved. For example, during the processing of a wafer to make integrated circuitry it will be recognized that very precise alignment between a wafer and a photolithography mask must be achieved right at the photographic station. It is for these reasons that the apparatuses and methods to which the invention related generally are referred to as "pre-alignment" apparatuses and methods rather than "alignment" apparatuses and methods.

A wafer typically is transported to a prealignment station by a robot paddle or the like. For example, when a wafer is removed for processing from a transportation carrier at an integrated circuitry fabrication plant, it is pre-aligned. A robot removes the individual wafers from the transportation carrier and places them at the pre-alignment station. After being pre-aligned, i.e., after the wafer is properly oriented and its geometric center is located, it is placed in a processing carrier in the pre-aligned condition.

It will be appreciated from the above that precise pre-alignment not only is desirable but can be a major factor in determining ultimate reliability of the integrated circuitry produced on a wafer. Many operations require very accurate alignment, and accurate pre-alignment reduces the mechanical and operational constraints in achieving such alignment.

Pre-alignment of the center of a wafer was achieved in the not too distant past by actually contacting the edge of the wafer to move the wafer as necessary to place its center in a specified position. Such edge contact resulted in the generation of particles which contaminated the active surface, i.e., the surface of the wafer to have integrated surface formed on the same. Because such contamination cannot be tolerated in most situations, those in the art have turned to non-contact, edge sensing with the only physical contact with the wafer occurring at its inactive surface. Examples of the same can be found in U.S. Pat. Nos. 4,457,664 issued Jul. 3, 1984 and 4,765,793 issued Aug. 23, 1988. European patent application No. 88101813.9 published Aug. 17, 1988 (Publication No. 0 278 462) also discloses an edge sensing pre-alignment apparatus.

It should be noted that some efforts have been made to obtain higher accuracy in the prealignment stage. Generally, though, there is macrotransportation of a wafer during the pre-alignment process. Macro-transportation, particularly by the same means which provides pre-alignment, results in inaccuracies. Furthermore, most pre-alignment processes require disengagement between the wafer and the chuck or other wafer engagement means during the pre-alignment process. This disengagement typically results in slight inaccuracies creeping in, because of differing spatial relationships between the chuck and wafer during the pre-alignment operation. It should be noted that in some instances, such as with the apparatus described in the European patent publication identified above, the calculations for centering determined at one station are transmitted to another station. This approach has the same problem in the sense that there is a disengagement of the engagement means (albeit more than one chuck) from the wafer during pre-alignment.

SUMMARY OF THE INVENTION

The present invention includes a prealignment apparatus for semiconductor objects which minimizes or obviates the above problems. For one thing, the object engagement means or chuck holds the object in a non-slip manner, and motive means are included for adjusting the position of the engagement means and the object together as necessary to make the geometric center of the object precisely coincident with a chosen position. In other words, the position adjustment of the wafer or other semiconductor object is made without disengaging the chuck from the wafer. Thus, separation of the engagement means from the object during the pre-alignment is eliminated as a potential source of inaccuracies. Most desirably, the engagement means is a chuck which is mounted on an X—Y table structure for movement in normally related directions in a plane orthogonal to its rotational axis.

The invention also includes an alignment method which eliminates inaccuracies which typically are provided in the mathematical determination of the location of a wafer center. Most of such determinations rely on relatively complicated functions relating the distances between a wafer rotation center and points sensed on a wafer edge as the wafer rotates. These functions are difficult to solve exactly, leading to inaccuracies. For example, most calculations rely on a least square sine fit with a curve defined by a relatively complicated equation which relates the current distance between an edge point and the center of rotation to the rotation angle. While this provides an approximate sine curve, making the use of a least square sine fit approach feasible, the fit is an approximation. In the instant invention an elegant equation is obtained by eliminating parts of the original equations. For example, an equation defining an exact sine wave is obtained with the preferred embodiment making the least square sine approach resolving the equation provide exact results. This is accomplished by combining two measurements on opposite sides of the center of rotation in such a way that portions of the original equations are eliminated. This use of a pair of opposite points provides a much more accurate center determination than the use of a calculation based on sensing a single edge point as in the past.

The invention includes other features and advantages which will be described or will become apparent from the following more detailed description of a preferred embodiment.

BRIEF DESCRIPTION OF THE DRAWINGS

With reference to the accompanying two sheets of drawing.

DETAILED DESCRIPTION OF THE PREFERRED EMBODIMENT

Figure 1:
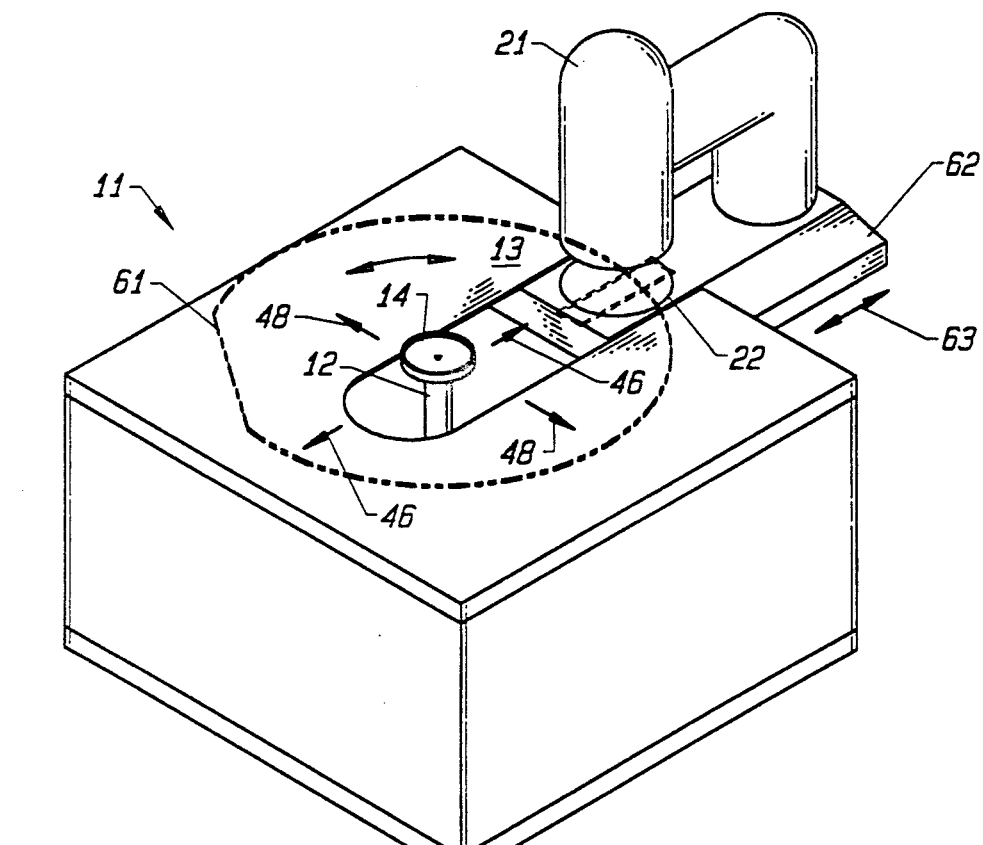
FIG. 1 is an overall isometric view illustrating a preferred embodiment of the invention.

FIG. 1 is an overall view of pre-alignment apparatus, generally referred to by the reference numeral 11, incorporating the invention. Such apparatus includes, as is typical of a non-contact prealigner, engagement means in the form of a chuck 12 for engaging the inactive flat surface of a wafer. In this connection, a wafer typically is provided with two flat surfaces, an active flat surface for the formation of integrated circuitry or the like and an inactive surface (often referred to as the wafer "backside") which need not meet the stringent criteria and tolerances required for the active surface.

A wafer to which the chuck 12 is adhered is illustrated at 13. It is shown in phantom in FIG. 1 and in full in FIG. 2. Chuck 12 includes a flat head face 14 orthogonal to the axis of rotation of the chuck and which mates with the inactive surface of the wafer. This construction facilitates removable adherence between the wafer and chuck. A vacuum can be used simply for this purpose. To this end, a vacuum passageway 17 (FIG. 2) is provided extending axially through the chuck from a manifold 18 to its head face 14. A suitable vacuum produced by a vacuum source (not shown) can be selectively introduced to the manifold through nipple 19 and, hence, introduced to the head to enable the desired selective securance.

Sensing means for sensing changes in the location of the circular edge of the wafer 13 is generally represented in the figures by reference numeral 21. Such sensing means is an optical sensor and includes, in this connection, a linear detector 22 for detecting optical radiation. A source of optical radiation is provided on the opposite side of the expected travel path of a wafer edge. Such source includes a generator of optical radiation, such as light emitting diode 24, a diffuser 26 for intercepting light therefrom, a pin hole plate (not shown) for providing a point light source and a collimating lens 27 which transforms such light into parallel rays.

Detector 22 includes a linear detector array 28 located below an optical filter 29 designed to only pass to the detector, radiation within a limited frequency band. It will be appreciated that such optical filter can be selected to prevent stray radiation from reaching the detector and causing inaccurate readings.

Figure 2:
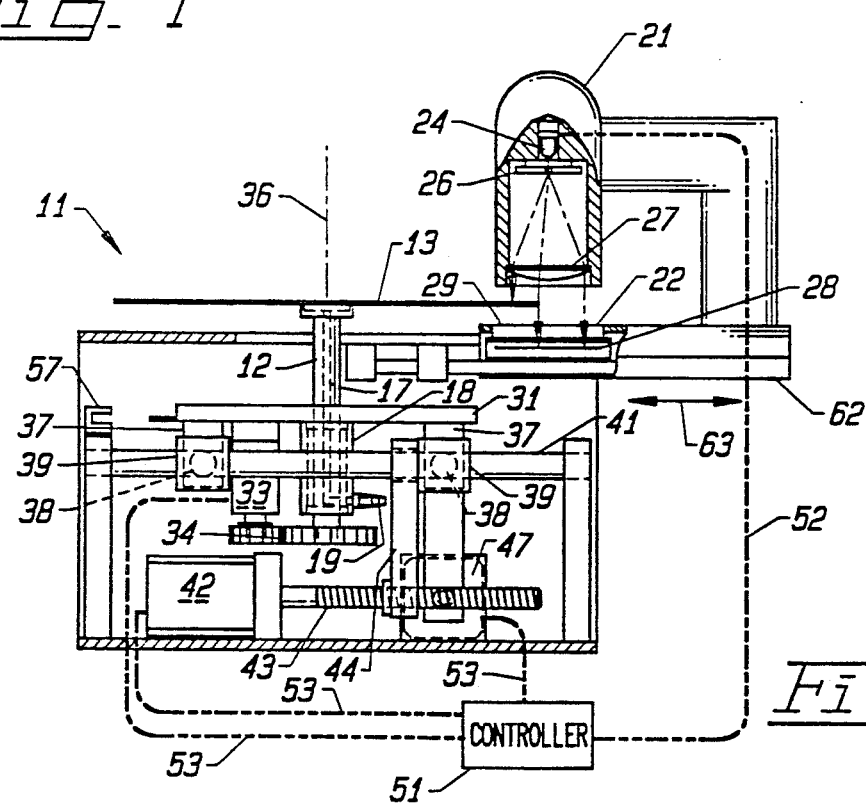
FIG. 2 is a schematic side view of the embodiment of FIG. 1.

In operation, the amount of illumination of the detector 28 by the source 23 will be directly dependent on the degree to which the wafer extends between the source and the detector 22 as best illustrated in FIG. 2. That is, the number of segments in the linear array which are illuminated at any given time by the sensor will be directly dependent on the amount of such wafer penetration and, hence, the voltage or other value of the electrical signal generated by the detector array will be indicative of the wafer edge. The general manner of the operation of such an edge sensor is not new and reference is made to the U.S. patents and European patent publication identified above for a fuller description. Edge sensing as it relates to the instant invention will be discussed in more detail below.

Prior pre-alignment apparatuses generally require that the pre-alignment chuck be disengaged from a wafer and re-engaged with the same at the wafer center. As one major feature of the instant invention, it eliminates these disengagement and re-engagement steps. That is, both the chuck and the wafer are moved together to make the geometric center of the wafer precisely coincident with a chosen reference position. To this end, the chuck 12 is mounted on an X-Y table mechanism which enables it to be moved in a plane which is orthogonal to its rotational axis. As best illustrated in FIG. 2, the chuck 12 is mounted on a plate 31. Such chuck depends below the plate through a manifold 18 to facilitate connection to the same of the vacuum as discussed above. A motor 33 for rotating the chuck projects downwardly from the underneath side of the plate. Such motor is connected via gearing or a suitable pulley arrangement 34 to rotate the chuck construction about its axis of symmetry 36. It will be appreciated that with this construction the rotating mechanism for the chuck will move with the plate 31 and, hence, with such chuck.

Plate 31 is movable in an X-Y plane. It is mounted via a pair of sleeves 37 for movement along a pair of slide rods 38. Rods 38 are in turn mounted on collars 39 which are slidably mounted on a pair of rods 41 supported within the apparatus orthogonal to the rods 38.

The respective pairs of rods 38 and 41 are in a plane which is parallel to the plane of table 31. In this connection, it will be noted that only one of the rods 41 is illustrated in FIG. 2—the other is hidden from view behind the one illustrated. It will be appreciated that movement of the table on the sleeves 37 slidably received on the rods 38 will result in movement of the plate 31 in the directions into and out of the page of the drawing, whereas movement of the collars 39 to which the rods are secured along the rods 41 will provide movement of the plate along the plane of the sheet.

Motor arrangements are included to provide and control such movement. Insofar as movement on the rods 41 is concerned, a motor 42 rigidly mounted on the apparatus has a lead screw 43 secured to its output shaft. Rotation of the screw 43 is translated into linear motion of an elongated intermediate bar 44 having one end threadably received on the screw 43 and its other end secured to one of the collars 39. It will be appreciated that with this construction rotation of the lead screw 43 by motor 42 will provide movement of the plate 31 in the directions indicated in FIG. 1 by the arrows 46. A similar motor 47 and a lead screw-elongated bar construction is provided for movement of the sleeves 37 along the bars 38. In this connection, the lead screw as illustrated in FIG. 2 extends from the motor out-of-the-page and the motor is movable within the apparatus. Movement in the directions controlled by the motor construction 47 is represented in FIG. 1 by arrows 48.

Operation of the motors 42 and 47 and the rotation motor 33 are controlled by a controller represented at 51. Such controller includes a suitable microprocessor, having both a CPU (central processor unit) and memory. It receives input from the sensor 21 as schematically represented by line 52, and its output to the motors is schematically represented by the lines 53. Such control will be described in connection with a description of a typical operation of the invention.

When the pre-aligner apparatus is initiated, the first step in its operation is an automatic calibration of the sensor 21. This calibration can be best understood from FIG. 3. The motors 42 and 47 are rotated to the extent necessary to move the chuck to a "home" position 56 as illustrated in dotted lines. This position is determined by an appropriate limit switch construction as is represented at 57 in FIG. 2. It is then moved to the position represented at 58 A wafer or a representation of the same is then adhered to the chuck, and such chuck advances incrementally to the extreme position represented at 59. As it advances, the wafer edge will advance through the optical sensor and correspondingly change the amount of optical energy that is detected. The value, such as the voltage state, of the electrical output of each of the detectors in the detector array is correlated with the wafer edge position represented by the same.

It should be noted that either a special calibration wafer can be used for this calibration step or an actual wafer to be pre-aligned. Moreover, a representation for the edge of a wafer can be used.

After such calibration, the apparatus is ready for pre-aligning wafers. A wafer to be prealigned is delivered by a robot paddle or the like to i the chuck head face 14. Vacuum is energized to adhere such wafer to the chuck. The chuck and wafer are then rotated and the linear movement, if any, of the wafer edge will be sensed. This movement is sensed by sensing the position of points on the edge of the wafer as it is rotated. The distance to the rotational axis of the wafer is then easily calculated. If by luck the geometric center of the wafer coincides with the axis of rotation of the chuck, this distance will be a constant as the chuck rotates. If this is not the case, the graphical relationship of the distance to the rotational angle of successive points will be a curve that will approximate a sine curve with the amplitude of the same being dependent upon the amount of misalignment, i.e., the distance between the rotational center of the chuck and the geometric center of the wafer. Calculations for various points along an edge can be combined to indicate the location of the wafer geometric center.

The misalignment for each point is a function of the rotational angle and can be expressed in the following equation:

$$r = E \cos(\alpha_0 + \alpha_1) + \sqrt{R^2 - E^2 \sin^2(\alpha_0 + \alpha_1)}$$

where:
  $r$ = distance between the axis of rotation and the edge point;
  $E$ = distance from said rotational axis to the geometric center of said object (misalignment);
  $\alpha_1$ = a known arbitrary angle of rotation;
  $\alpha_0$ = an unknown angle between the starting position of the geometric center of the wafer and the sensor position, taken about the axis of rotation; and
  $R$ = wafer radius.

Figure 4:
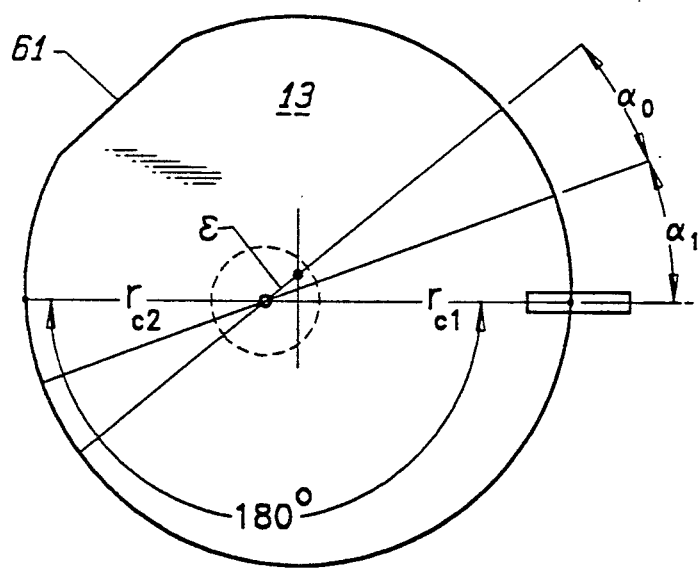
FIG. 4 is a view of a typical wafer showing the angular and linear relationships used in calculating the location of the wafer center.

These values are represented in FIG. 4. It will be seen that while the above equation represents an approximation of a sine curve, it does not represent a true sine curve because of the existence of the square root. As one aspect of the instant invention, it includes a calculation method to eliminate the square root portion from the above equation and thereby enable a true sine wave to be used in subsequent aspects of the calculation of the position of the geometric center. This facilitates solving the equations by, for example, a least square sine fit so that an exact determination of the geometric center can be obtained. To this end, a pair of points are used in the calculation, the point sensed at any given time and the information from the point sensed on the opposite side of the rotational axis, 180° apart from the same. The resultant "a" can be obtained by, for example, subtracting one equation from the other to provide a result which does not include the square root portion. The equation is the following:

$$a = r_{c1} - r_{c2} = 2E \cos(\alpha_0 + \alpha_1)$$

where:
  $E$ = distance from said rotational axis to the geometric center of said object;
  $\alpha_1$ = a known arbitrary angle of rotation;
  $\alpha_0$ = an unknown angle between the starting position of the geometric center of the wafer to the sensor position taken about the axis of rotation; and
  $r_{c1}$ and $r_{c2}$ = the distance on opposite sides of said rotational axis to the respective points of a pair.

It will be seen from the above that the combination has resulted in the square root portions being eliminated. Thus, a true sine curve is defined to enable accurate misalignment calculations (i.e., $E$, $\alpha_0$) to be made by, for example, a least square sine fit approach.

A large number of points along the edge of a wafer are sensed to provide numerous pairs. The resultants and corresponding rotational angle for such pairs are combined by least square method calculations to provide the misalignment, i.e., the distance ($E$) and angular position ($\alpha_0$) of the geometric center of the wafer from the actual rotational axis. This can be achieved with measurements taken during a single revolution of a wafer. Once the geometric center is located, the chuck is moved by the motors 42 and 47 as necessary to make such geometric center coincident with a chosen position. When the wafer is later removed from the prealigner, such center will be positioned at a desired location.

Wafers include not only a geometric center, but a distinguishing feature, such as a flat or notch, which defines the crystalline orientation of the same. (In this connection, the term "geometric center" as used herein is meant to identify the geometric center of the wafer when all discontinuity(ies) caused by such distinguishing feature or features are ignored.) The invention includes identifying such distinguishing feature with accuracy. That is, those distinguishing features now used (flats and notches) represent discontinuities in the geometry of a wafer edge. Wafer 13 includes a flat 61. Thus, adjacent edge segments, each of which is made up of a plurality of edge points, are compared to identify any discontinuity at their juncture. Sequential sections overlap one another by several points.

It will be recognized that the following equation defines adjacent segments having a point of measurement, such as $M_i$ at their center:

$$B_i = b_{i-k}M_{i-k} + b_{i-1}M_{i-1} + b_iM_i - b_{i+1}M_{i+1}b_{i+k}M_{i+k} - b_{i+k+1}M_{i+k+1}$$

where
- $B_i$ = is a section indicator of said edge having sensed points i, i+1 at its center defining the boundary between said adjacent segments;
- b's = are the weight coefficients of the respective sensed points;
- M's = are the results of point sensing.

This equation is compared with a value indicative of an edge discontinuity between segments. Discontinuities will be detected at the junctions between the flat and the circular edge. This will identify data relating to the location of such flat. This data is used to define the location of the flat by using a straight line fit with the least square method. In keeping with the invention, the chuck 12 will be rotated to place it and, hence, the wafer into a desired orientation. It should be noted that if the distinguishing feature is a notch, the least square method can be used to fit a parabola.

Depending upon the number of points it may be desirable to rotate the wafer at a reduced speed for a second revolution through a small rotational angle for exactly determining the location of a distinguishing feature. That is, while the approach of simply identifying discontinuities enables one to detect the edges of a flat, if the distinguishing feature is a notch it may be necessary to make measurements based on a larger number of sensed points than those used to determine the geometric center of the wafer. A second revolution of the wafer at a reduced speed and generally limited to the sensed location of the discontinuity can be used for greater accuracy.

Figure 3:
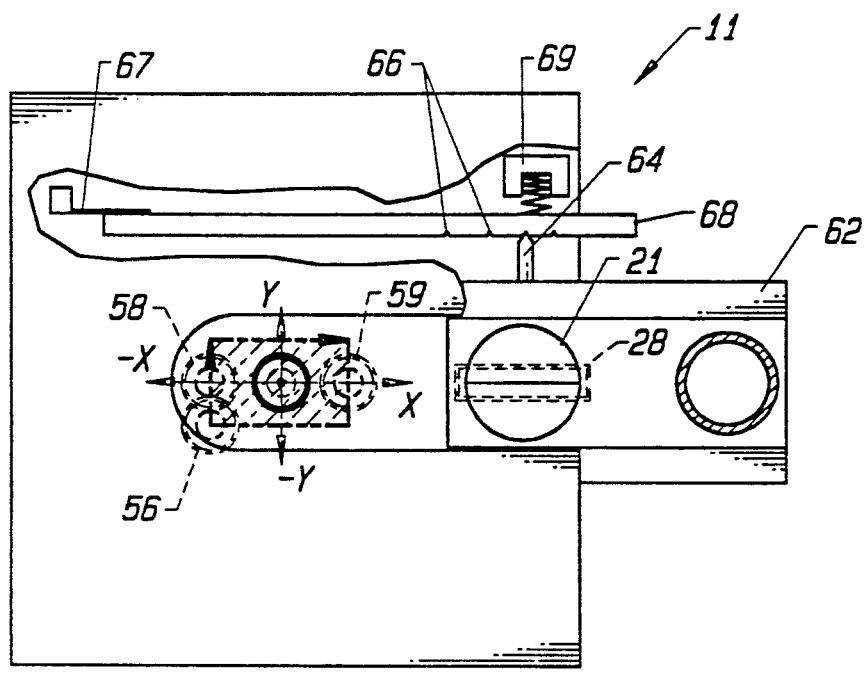
FIG. 3 is a schematic plan view of such embodiment.

It should be noted that as another feature of the instant invention, in determining the location of the geometric center, calculations based on sensed points found to represent a distinguishing feature are ignored. The result is even greater accuracy. As another feature of the invention, the location of the sensor 21 relative to the remainder of the apparatus is adjustable so that differently sized wafers can be accommodated or the sensor can be removed from above a wafer. Such sensor is mounted on a table 62 as illustrated whose position can be adjusted as indicated by the arrow 63 toward and away from the chuck. As illustrated in FIG. 3, the table 62 is provided with a projecting pin 64 which is engageable within notches 66 on an adjustment bar located within the apparatus. One end of such adjustment bar is mounted within the apparatus by a leaf spring arrangement 67 allowing limited pivotal motion. The other end of the same, free end 68, projects from the apparatus to enable manual pivoting of the arm to release a notch 66 from the pin 64. A compression spring arrangement 69 is provided to normally urge the arm into engagement with such pin.

It will be seen from the above construction that the location of the sensor relative to the chuck can be simply adjusted by appropriate manipulation. However, this operation could be motorized, if desired.

It should be noted that the use of sensed points for calculating a wafer's geometric center is not made except when the chuck and, hence, the wafer are rotating at a constant speed. In other words, rotation acceleration and deceleration are ignored. This enhances accuracy. Although for simplicity in this particular embodiment in which rotation is used the desired affect can be obtained simply by ignoring acceleration and deceleration, from the broad standpoint what is important is that any movement between adjacent points be at a known rate and this rate be taken into account in the calculations.

Although the invention has been described in connection with a preferred embodiment, it will be appreciated by those skilled in the art that various changes and modifications can be made. For example, while it is described in connection with pre-aligning a semiconductive wafer, the principles of the invention are also applicable to aligning other semiconductor objects, such as masks. Moreover, the principles may well be used in apparatuses other than apparatuses for pre-aligning semiconductor objects. In view of this, it is intended that the coverage afforded applicant be limited only by the claims and their equivalents.

What is claimed is:

1. In a method of aligning a semiconductor object, the steps comprising:
   sensing by rotating said object about a rotational axis, a plurality of points about an edge of said object on opposite sides of said rotational axis to form a plurality of pairs of points opposed to one another
   using the following relationship to calculate the location of the geometric center of said object:

$$r = E \cos(\alpha_0 + \alpha_1) + \sqrt{R^2 - E^2 \sin^2(\alpha_0 - \alpha_1)}$$

where:
- r = distance from said rotational axis to each of said points;
- E = distance from said rotational axis to the geometric center of said object;
- $\alpha_1$ = a known arbitrary angle of rotation;
- $\alpha_0$ = an unknown angle between the starting position of the geometric center of the wafer and the sensor position, taken about the rotational axis; and
- R = wafer radius;

subtracting from one another as part of said calculation, the distance of the points of each pair from said rotational axis to provide a resultant "a" associated with each of said pairs defined by the equation:

$$a = r_{c1} - r_{c2} = 2E \cos(\alpha_0 + \alpha_1)$$

where:
   $r_{c1}$ and $r_{c2}$ are the distances on opposite sides of the rotational axis to the respective points of a pair.

2. The method of claim 1 further including:
   locating a distinguishing feature on the edge of said object.

3. The method of claim 2 further including the step of ignoring pairs of points about said edge representative of said distinguishing feature in said step of calculating the location of the geometric center of said object.

4. In a method of aligning a semiconductor object, the steps comprising:

sensing a plurality of pairs of points about an edge of said object, the points of each of said pairs being on opposite sides of a selected location;

combining the distances of the points of each pair from said selected location to provide a resultant associated with each of said pairs;

calculating the locating of the geometric center of said object by using the resultants of said plurality of pairs;

locating a geometric discontinuity in the shape of the edge of said object by comparing adjacent segments of said object edge to find data defining the discontinuity and using such data to calculate the located of such geometric discontinuity; and wherein said step of comparing adjacent segments of said object edge includes calculating the value of a section indicator as defined below from the following equation for a plurality of overlapping sections of said object edge, each of which contains at least two segments:

$$B_i = b_{i-k}m_{i-k} + \cdots - b_{imi-1} + b_i m_i - b_{i+1}m_{i+1} - \cdots - b_{i+k}m_{i+k} - b_{i-k-1}m_{i-k-1}$$

where: —

$B_i$ = is a section indicator of said edge having sensed points i, i+1 at the center of the section, defining the boundary between said two segments;

b's = are the weight coefficients of the respective sensed points;

m's = are the various results of point sensing;

k's = are indices, each of which discretely identifies a sensed point;

and comparing the calculated value with a value indicative of an edge discontinuity between two segments.

5. The method of claim 1 wherein said step of sensing a plurality of pairs of points about an edge of said object includes rotating the object and measuring the position of said pairs of points only when said object is rotating at a constant speed.

6. The method of claim 2 and further including:

orienting said object in a desired orientation relative to the location of said distinguishing feature.

7. A method of aligning a semiconductor object comprising the steps of:

rotating said object about a rotational axis;

sensing a plurality of pairs of points about an edge of said object by an edge sensor when said object rotates about said axis at a constant speed, the points of each pair being generally 180° from one another on opposite sides of said rotational axis using the following relationship to calculate the location of the geometric center of said object:

$$r = E \cos(\alpha_0 + \alpha_1) + \sqrt{R^2 - E^2 \sin^2(\alpha_0 - \alpha_1)}$$

where:

r = distance from said rotational axis to each of said points;

E = distance from said rotational axis to the geometric center of said object;

$\alpha_1$ = a known arbitrary angle of rotation;

$\alpha_0$ = an unknown angle between the starting position of the geometric center of the wafer and the sensor position, taken about the axis of rotation; and R = wafer radius;

subtracting from one another as part of said calculation the distances of the points of each pair from said rotational axis to provide a resultant "a" associated with each of said pairs defined by the equation:

$$a = r_{c1} - r_{c2} = 2E \cos(\alpha_0 + \alpha_1)$$

where:

$r_{c1}$ and $r_{c2}$ are the distances on opposite sides of the rotational axis to the respective points of a pair; and moving said semiconductor object to place said geometric center at a chosen position.

8. The method of claim 7 wherein said step of sensing is accomplished with an edge sensor which generates a plurality of signals having values respectively indicative of differing edge positions relative to the location of said sensor, further including the step of calibrating said sensor by:

placing a semiconductor object of the type to be aligned, or a representation of the same, at said differing edge positions;

measuring the signal value that is generated at each of said positions; and correlating each of said signal values with the edge position responsible for the same.

9. The method of claim 7 wherein said semiconductor object has a distinguishing feature on said edge which is a geometric discontinuity in the shape of the edge of said object, further including the steps of:

comparing adjacent segments of said object edge to locate data defining said distinguishing feature;

calculating the location of said distinguishing feature; and thereafter rotating said object to a desired orientation based on the location of said distinguishing feature.

10. In a method of aligning a semiconductor object having a distinguishing feature on its edge which is a geometric discontinuity in the shape of said edge, the step of:

comparing adjacent segments of said object edge to locate data defining said distinguishing feature, including calculating the value of a section indicator as defined below from the following equation for a plurality of overlapping sections of said object edge, each of which contains at least two segments:

$$B_i = b_{i-k}m_{i-k} + \cdots - b_{i-1}m_{i-1} + b_i m_i - b_{i+1}m_{i+1} - \cdots - b_{i+k}m_{i+k} - b_{i+k+1}m_{i+k+1}$$

where:

$B_i$ = is a section indicator of said edge having sensed points i, i+1 at the center of the section, defining the boundary between said two segments;

b's = are the weight coefficients of the respective sensed points;

m's = are the various results of point sensing; and k's = are indices, each of which discretely identifies a sensed point;

and comparing the calculated value with a value indicative of an edge discontinuity between two segments.

11. The method of claim 10 wherein said distinguishing feature is a flat, further including the step of using data defining the flat to fit a straight line by a least square method.

12. In a method of aligning a semiconductor object, the steps comprising:
sensing a plurality of pairs of points about an edge of said object, the points of each of said pairs being on opposite sides of a selected location and spaced generally 180° apart;
combining the distances of the points of each pair from said selected location to provide a resultant associated with each of said pairs;
calculating the location of the geometric center of said object by using the resultants of said plurality of pairs;
locating a geometric discontinuity in the shape of the edge of said object by comparing adjacent segments of said object edge to find data defining the discontinuity and using such data to calculate the location of such geometric discontinuity;
wherein said step of comparing adjacent segments of said object edge includes calculating the value of a section indicator from the following equation for a plurality of overlapping sections of said object edge, each of which contains at least two segments:

$$B_i = b_{i-k}m_{i-k} + -b_{i-1}m_{i-1} + b_i m_i - b_{i+1}m_{i-1} - -b_{i+k}m_{i+k} - b_{i+k+1}m_{i+k+1}$$

where:
$B_i$ = is a section indicator of said edge having sensed points i, i+1 at the center of the section, defining the boundary between said two segments;
b's = are the weight coefficients of the respective sensed points;
m's = are the various results of point sensing;
K's = are numbers individually identifying sensed points; and comparing the calculated value with a value indicative of an edge discontinuity between two segments.

13. The method of claim 3 wherein said step of calculating the location of the geometric center of said object includes using a fit with the least square method.

* * * * *